(12) United States Patent
Namboodiri et al.

(10) Patent No.: US 10,655,970 B2
(45) Date of Patent: May 19, 2020

(54) BEACON-BASED INDOOR WAYFINDING SYSTEM WITH AUTOMATED BEACON PLACEMENT

(71) Applicant: Wichita State University, Wichita, KS (US)

(72) Inventors: Vinod Namboodiri, Wichita, KS (US); Seyed Ali Cheraghi, Wichita, KS (US)

(73) Assignee: Wichita State University, Wichita, KS (US)

( * ) Notice: Subject to any disclaimer, the term of this patent is extended or adjusted under 35 U.S.C. 154(b) by 78 days.

(21) Appl. No.: 16/123,659

(22) Filed: Sep. 6, 2018

(65) Prior Publication Data

US 2019/0072395 A1  Mar. 7, 2019

Related U.S. Application Data

(60) Provisional application No. 62/555,424, filed on Sep. 7, 2017.

(51) Int. Cl.
| | |
|---|---|
| G01C 21/20 | (2006.01) |
| G06K 9/00 | (2006.01) |
| H04W 4/80 | (2018.01) |
| G06T 7/11 | (2017.01) |
| G06T 7/194 | (2017.01) |
| G06F 30/13 | (2020.01) |
| G06F 30/18 | (2020.01) |
| H04W 4/02 | (2018.01) |

(Continued)

(52) U.S. Cl.
CPC .......... *G01C 21/206* (2013.01); *G06F 30/13* (2020.01); *G06F 30/18* (2020.01); *G06K 9/00476* (2013.01); *G06K 9/4604* (2013.01); *G06T 7/11* (2017.01); *G06T 7/194* (2017.01); *H04W 4/80* (2018.02); *H04W 4/02* (2013.01); *H04W 4/33* (2018.02)

(58) Field of Classification Search
None
See application file for complete search history.

(56) References Cited

U.S. PATENT DOCUMENTS

| | | |
|---|---|---|
| 9,913,090 B2 | 3/2018 | Phillips-Lubimiv et al. |
| 9,992,633 B2 | 6/2018 | Geng et al. |

(Continued)

OTHER PUBLICATIONS

S. A. Cheraghi, et al., IBeaconMap: Automated Indoor Space Representation for Beacon-Based Wayfinding, arXiv:1802.05735v1 [cs.HC] Feb. 15, 2018.

(Continued)

*Primary Examiner* — Abdhesh K Jha
(74) *Attorney, Agent, or Firm* — Stinson LLP

(57) ABSTRACT

An automated process designs an indoor wayfinding system using wireless beacons interacting with a mobile smartphone to guide a user to a destination. Image processing and computational geometric techniques extracting necessary information about an indoor space to determine beacon placement and support path computations for navigation. An architectural floor plan of the indoor space of interest is scanned to extract all the points of interest (doors, stairs, elevators, etc.), to identify walking paths within this space, and to create a connectivity graph representation of the space upon which path computations for navigation can be performed. Optimized locations where beacons should be placed on the indoor floor plan are identified very quickly and with minimal effort.

18 Claims, 12 Drawing Sheets

(51) Int. Cl.
*H04W 4/33* (2018.01)
*G06K 9/46* (2006.01)

(56) References Cited

U.S. PATENT DOCUMENTS

2015/0330787 A1  11/2015  Cioffi et al.
2017/0265041 A1   9/2017  Mahasenan et al.
2017/0369278 A1  12/2017  Chapman et al.

OTHER PUBLICATIONS

S. A. Cheraghi, V. Namboodiri and L. Walker, "GuideBeacon: Beacon-based indoor wayfinding for the blind, visually impaired, and disoriented," 2017 IEEE International Conference on Pervasive Computing and Communication (PerCom), Kona, HI, 2017, pp. 121-130.
Jianbo Shi, et al., Good Features to Track, IEEE Conference on Computer Vision and Pattern Recognition (CVPR94) Seattle, Jun. 1994.
C. Piech, K Means, http://stanford.edu/~cpiech/cs221/handouts/kmeans.html, printed Aug. 27, 2018.
Weston, Support Vector Machine Tutorial, www.cs.columbia.edu/~kathy/cs4701/documents/jason_svm_tutorial.pdf, printed Aug. 27, 2018.

BEACON-BASED INDOOR WAYFINDING SYSTEM WITH AUTOMATED BEACON PLACEMENT

CROSS REFERENCE TO RELATED APPLICATIONS

This application claims the benefit of U.S. Provisional Application Ser. No. 62/555,424, filed Sep. 7, 2017, which is incorporated herein by reference in its entirety.

STATEMENT REGARDING FEDERALLY SPONSORED RESEARCH

Not Applicable.

BACKGROUND

The present disclosure relates in general to indoor wayfinding systems for the blind, visually impaired, and disoriented, and, more specifically, to optimizing placement of Bluetooth Low Energy (BLE) beacons within a site or building with efficient use of time and effort.

Traditionally there have been few options for navigational aids for the blind and visually impaired (BVI) in large in-door spaces. Some recent indoor navigation systems allow users equipped with smartphones to interact with low cost Bluetooth-based beacons deployed strategically within the indoor space of interest to navigate their surroundings. A major challenge in deploying such beacon-based navigation systems is the need to employ a time and labor-expensive beacon deployment process to manually identify potential beacon placement locations and arrive at a topological structure representing the indoor space.

Way finding can be defined as knowing where you are in a building or an environment, knowing where your desired location is, and knowing how to get there from your present location. For outdoor environments, recent advances in global positioning systems (GPS) and mapping technologies provide accurate and simple to use means for way finding. For indoor environments, reading and following signs remains the easiest and most reliable option because GPS and associated advances for outdoor environments typically do not apply. This has, however, meant that indoor way finding has remained a challenge for the blind and visually impaired (BVI) in our society. Indoor environments can be geographically large and intimidating such as grocery stores, airports, sports stadiums, large office buildings, and hotels. A solution to the indoor way finding problem for the BVI also has broad applications for the sighted population. In unfamiliar, large indoor spaces, it is common for sighted people to be disoriented and have trouble finding their way around. This could be due to the lack of well marked signs and maps, or not being familiar with the conventions or language used on these signage, or just the fact that the layout of the space is disorienting.

One of the key building blocks of indoor way finding is knowing where a user is at all times in an indoor space. The challenge of indoor localization has been addressed by utilizing existing infrastructure or by adding additional infrastructure. The direction of using existing infrastructure in indoor spaces recently has largely revolved around using Wi-Fi access points (APs) that are already present. Under various assumptions, prior work has shown accuracies within a few meters. Although this direction achieves indoor way finding without any additional infrastructure costs, and allows users to use mobile devices they carry, the assumptions made have many limitations in achieving indoor way finding for the BVI. Most of these Wi-Fi based localization schemes require a very high density of Wi-Fi access points (three or more detectable at all times from the point of localization) to be accurate and useful. Furthermore, most of these schemes require additional hardware at the receiving device and/or APs and software mechanisms to be implemented at APs to assist with localization. Some of the proposed schemes also have the disadvantage that they require users to make certain device movements (such as rotating their device) for achieving accurate localization. This can be difficult for BVI users to do, especially those who already are using a cane or dog and will probably be mounting their smartphone in a pocket or strapping it onto themselves or an accessory.

Indoor way finding for the BVI does not require knowing the user's location at all times. Rather, it is more important to identify strategic points within an indoor space that a user should be localized at accurately (e.g., within 1-2 m localization error).

The approach of adding additional infrastructure in indoor spaces for localization has been explored in literature, primarily because of the potential of higher accuracies (compared to Wi-Fi based systems for example). Such work has included the use of technologies such as RFID, Ultra-Wideband (UWB), Ultrasound, Infrared (IR), and visible light. Many of these technologies (some specific to indoor way finding for BVI) are not effective for way finding indoors (and have rarely been used) because of the requirement of carrying additional hardware on the user, or more expensive or power-inefficient reference beacons in the environment. There have also been many attempts in the field of computer vision to assist with way finding for the blind and visually impaired. However, these tend to have high inaccuracies in the information read out when a user is mobile and text is not directly facing the user.

The most accurate and usable indoor way finding systems available to persons with low vision have relied on the use of radio frequency identification (RFID) tag technology. This solution, however, is not very flexible when it comes to changing embedded information on tags. Furthermore, the tag reader technology is expensive and can be difficult to integrate into current mobile systems. Other mechanisms that provide audible directions (e.g., Talking Signs® available from Talking Signs Services, Inc.) still need each user to possess special audio frequency devices capable of acting as receivers. In general, most approaches to solve this challenge require special hardware to be carried by the user. Such limitations have created barriers for widespread use and adoption for indoor way finding.

Systems have been disclosed (e.g., GuideBeacon and StaNavi) for way finding in large spaces using BLE beacons. For example, GuideBeacon discloses a smartphone-based system using a proximity detection algorithm to localize users and to provide walking directions as turn-by-turn instructions. The Wayfindr project is an effort to develop an open standard for navigation for the visually impaired in outdoor and indoor spaces, including the use of BLE beacons.

Thus, Bluetooth-based indoor localization is known. In particular, the introduction of Bluetooth Low Energy (BLE) provides improved localization over WiFi systems (e.g., accuracies as small as 0.53 m). Beacons are being deployed for interaction with smartphone apps to provide real-time location specific information using standardized protocols such as iBeacon from Apple and Eddystone from Google. All these recent trends in using BLE-beacons for localization indicate that the premise of using beacons for strategic localization is well-founded. By utilizing the increasing beacon deployments in indoor spaces, the infrastructure costs with beacon-based navigational systems are likely to be lower than with a system that is specifically designed only to be used for the BVI.

One major challenge facing beacon-based indoor way finding is that of creating fast and accurate representations of indoor spaces that can be used for beacon-placement and subsequent navigation computations. Manual determination of beacon placement locations and path computations is time-consuming and labor-expensive, especially for large indoor spaces. Such an approach requires the manual identification of walking paths on a floor plan, marking of points of interest, determining the distance between any two points of interest, determining the orientation between them for navigation, identifying shortest paths between points of interests, and subsequent adjustments to optimize the resulting paths that may require further iterations of the entire process. Another approach has been the use of mobile robots that can traverse an indoor space gathering information about walking paths within a space and allowing offline analysis of the gathered data to arrive at beacon placement locations and path computations for the space. This approach though not as labor-intensive as the manual process, is still time-consuming and requires expensive mobile robot hardware and software resources calibrated to work within each indoor space of interest. Crowdsourcing using people moving around the spaces that need to be mapped can be an effective way to create high quality maps inexpensively. However, this approach may not capture all areas of indoor spaces and the design and application of appropriate incentive mechanisms remains a challenge.

In summary, potential systems have been developed for BVI way finding using low-cost, stamp-size Bluetooth Low Energy (BLE) "beacon" devices embedded in the environment that interact with smartphones carried by users. Such beacon-based navigation systems have achieved promising preliminary results indicating that they may be a viable solution for indoor way finding for the BVI if some of the underlying challenges to the deployment of such systems can be overcome.

SUMMARY

Embodiments of the disclosure relate to an indoor space representation technique referred to as IBeaconMap that uses image processing and computational geometric techniques to automate the process of extracting the necessary information from an indoor space for subsequent beacon placement and path computations for navigation. IBeaconMap only needs as input an architectural floor plan of the indoor space of interest. It extracts all the points of interest (doors, stairs, elevators etc.), identifies walking paths within this space using a combination of image processing and computational geometry, and creates a weighted connectivity graph representation of the space with paths and directional orientations upon which routing computations for navigation can be performed. In addition, IBeaconMap provides locations where beacons can be placed on the indoor floor plan. Evaluations of IBeaconMap show that it can create space representations and recommended beacon placements that are highly accurate within the order of a few minutes, providing to be an essential tool to be utilized for mass deployments of beacon-based indoor way finding systems.

In one aspect of the disclosure, a method is provided for configuring a wayfinding system including identifying beacon locations within a navigating space. A scaled floor plan image is prepared, representing the navigating space as a binary image with a foreground and a background. Continuous regions of pixels are detected in the background. A continuous region in the background is selected having a largest pixel area as a main indoor path. Image features within the foreground are classified by comparison with predetermined target features to identify building blocks in the foreground which are coincident with the main path. The coincident building blocks and nodes within the main path are designated as navigational points of interest, wherein the nodes include intersections in the main path. The continuous pixel region of the main path is condensed into a skeleton representation. A preliminary beacon location is designated at each point of interest and at each node of the skeleton representation.

DETAILED DESCRIPTION OF PREFERRED EMBODIMENTS

The disclosure may support the set-up and configuration of a wayfinding system such as the GuideBeacon system described in Cheraghi et al, *Guidebeacon beacon-based indoor wayfinding for the blind, visually impaired and dioriented*. Proceedings of the 13th Annual Symposium on Graduate Research and Scholarly Projects, Wichita, K S, p. 26, 2017. Upon entering an indoor space for the first time, a GuideBeacon app on a smartphone (upon activation) announces the name of the indoor space and prompts the user to provide the desired destination. A phrase from the user is looked up in a database of points of interest (PoIs) in the indoor space (provided typically by the beacon manufacturer's platform as a Beacon Manager on a server or by the local system administrators of the beacon installation). If matches are found, they are listed out to the user one by one until the user confirms one of them. Upon confirmation that there is a match for the desired destination, the system then downloads the map of the building (by connecting to a server controlled by GuideBeacon system administrators) and calls the routing algorithm with the starting and destination points. The calculated end-to-end route is then used within the navigation module to provide turn-by-turn instructions.

Figure 1:
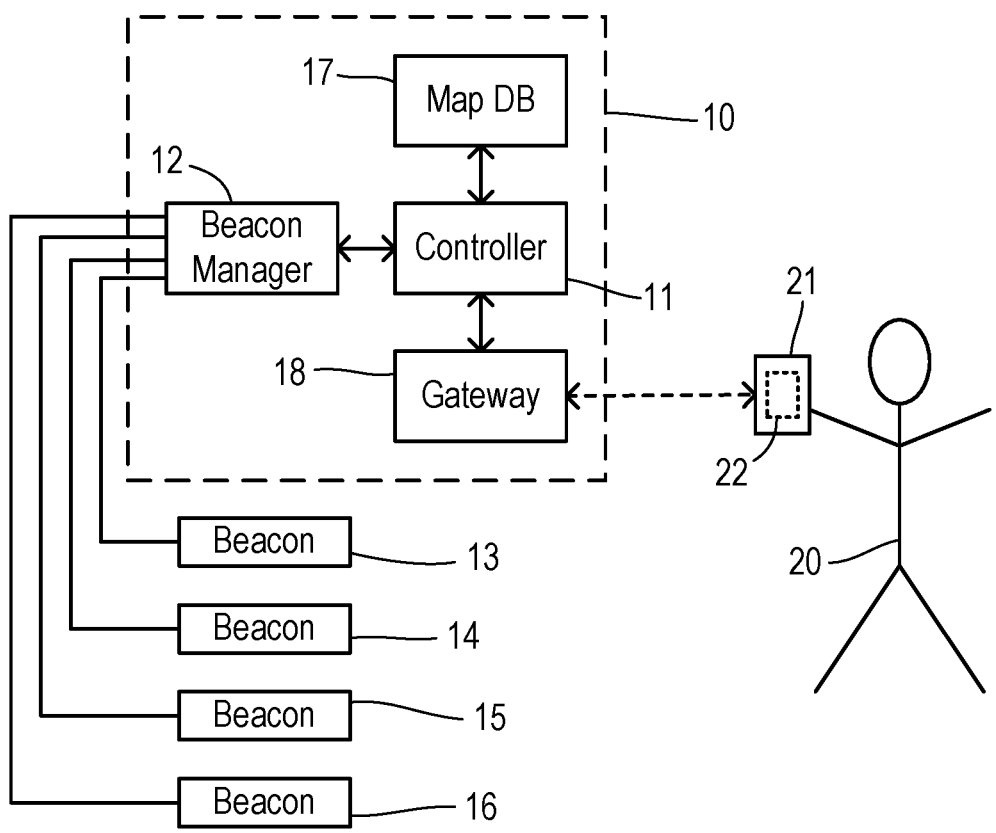
FIG. 1 is a block diagram showing various components of one embodiment of an indoor wayfinding system according to the present disclosure.
Figure 2:
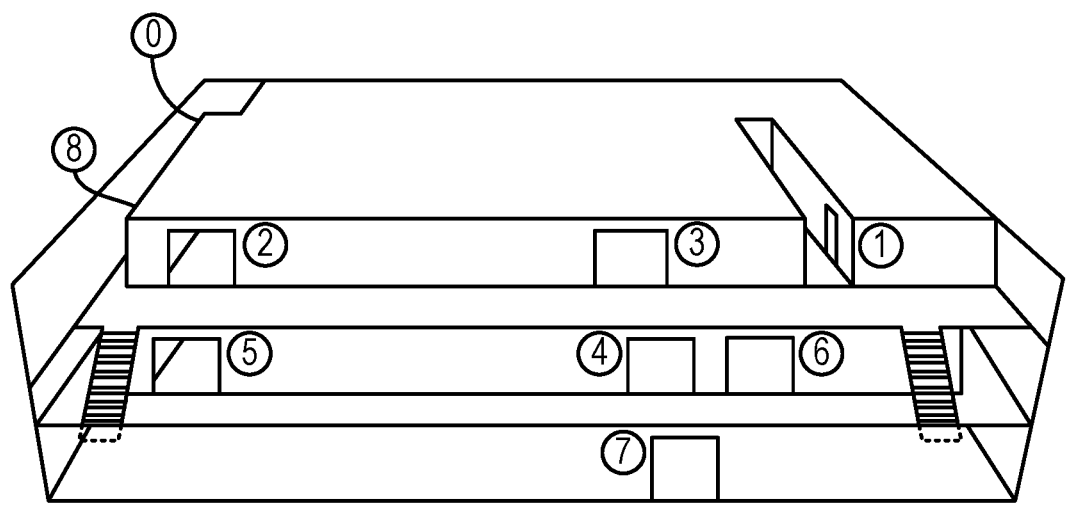
FIG. 2 is a three-dimensional view of a building space indicating BLE beacon locations for a wayfinding system.

FIG. 1 shows the main modules/components of the GuideBeacon system. A main server system 10 includes a main controller 11 which may be comprised of a general purpose CPU with appropriate programming according to the GuideBeacon functionality. A Beacon Manager 12 performs a function that may be implemented within the CPU or as a separate device. Beacon Manager 12 connects to a plurality of BLE beacons 13-16 which are deployed within a navigating space, e.g., an interior of a multi-story building as shown in FIG. 2. The connections between Beacon Manager 12 and beacons 13-16 may be a wired or wireless connection, for example. Each beacon 13-16 transmits a BLE signal from a fixed location within the navigating space to be used in localizing a user.

Server system 10 includes a map database 17 which defines a layout of the navigating space along with PoIs and walking segments with weights (e.g., distances) and orientations linking the PoIs. A gateway 18 links controller 11 with a smartphone 21 or other mobile device carried by a user 20. A GuideBeacon app 22 is executed by smartphone 21.

Figure 3:
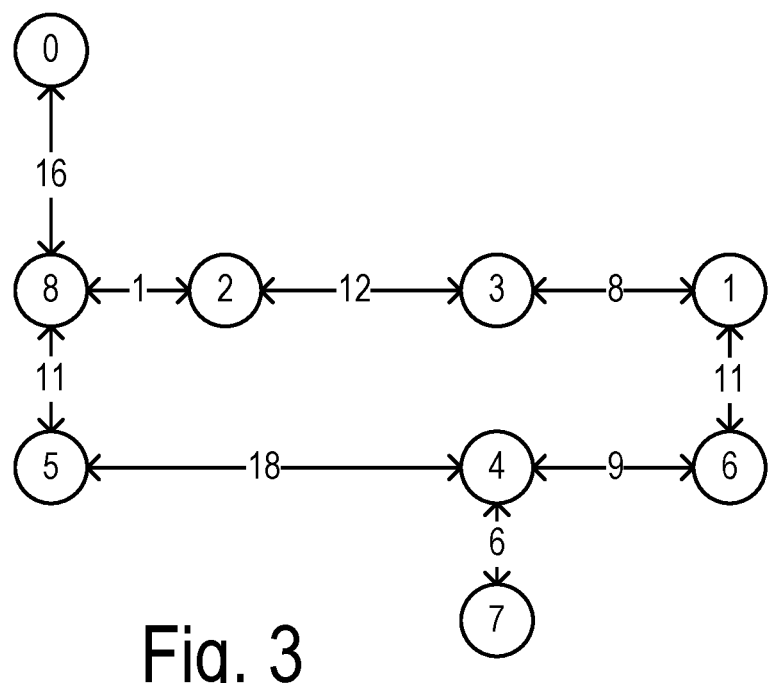
FIG. 3 is a wayfinding matrix with vertices corresponding to the building space of FIG. 1.
Figure 4:
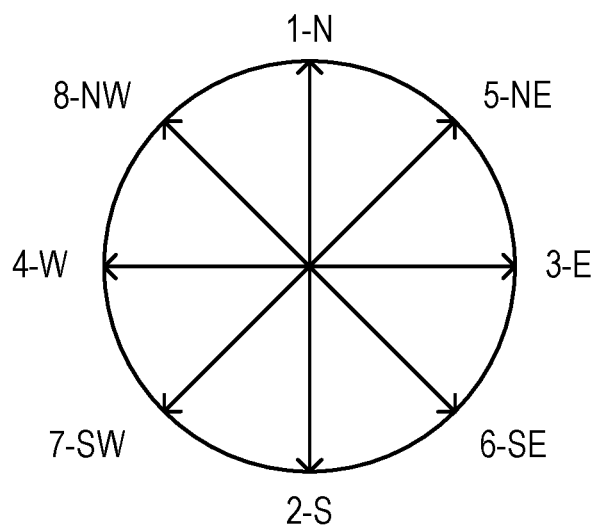
FIG. 4 shows compass orientation designations used in the matrix of FIG. 3.

FIG. 2 shows a typical indoor space that has been prepared for beacon placement using a known manual method, wherein beacon locations are identified as locations 0 through 8. In a manual method, all possible points of interest may be marked as beacon locations. Lines are drawn through the middle of all walking paths (including stairs) in the indoor space on a 3D-basis. All intersection points between lines may also be marked as beacon locations. On each line where marked beacon locations are more than x feet apart (where x is a predetermined distance less than a maximum receivable range for the beacons), additional beacon locations may be marked for every $$y \div \left\lfloor \frac{y}{x} \right\rfloor$$

feet from one of the PoIs, where y is the current separation of PoIs in feet before this step. At the end of these steps, the indoor space has all beacon locations marked out at which beacons can be installed (or at a nearest convenient location). For navigating purposes, a manually constructed connectivity graph of beacon-marked indoor spaces has been represented as strings of interconnected nodes, as shown in FIG. 3. Each beacon location, the outgoing paths and their directions, and transitions across floor levels are represented in these strings. Each path is also given a weight cost (e.g., a walking distance covered by a respective path). A compass direction associated with each path segment may be encoded by a numeral as shown in FIG. 4.

A system as shown in FIGS. 1-4 can cut the time required for the BVI to navigate unfamiliar indoor spaces by 30-50% while cutting the associated distance walked by more than 50% in most cases. Meaningful benefits are obtained even with a relatively small indoor space, and it can be expected that they can only get better when used in large indoor spaces for both BVI users and disoriented sighted users. However, configuring and deploying beacon-based way finding system in larger indoor spaces while the known manual methods requires a time and labor intensive beacon placement planning process to arrive at beacon locations, walking paths between beacons, distances and directional orientations for shortest path computations. As the scale of the indoor space increases, the number of PoIs in the space typically increases rendering a manual beacon placement planning process impractical. To solve this challenge, the disclosure automates the beacon placement planning process needing only an architectural floor plan image as input.

An embodiment of the disclosure referred to herein as IBeaconMap involves taking a two dimensional floor plan as input and providing a connectivity graph as output with all the necessary information (beacon locations, weights, direction/orientations) required for subsequent navigation. An example will be disclosed wherein one given floor plan of an indoor space is represented, however, in some instances there may be multiple such floor plans that will need to be analyzed (and merged) to arrive at a final representation for an entire building or other structure.

Figure 5:
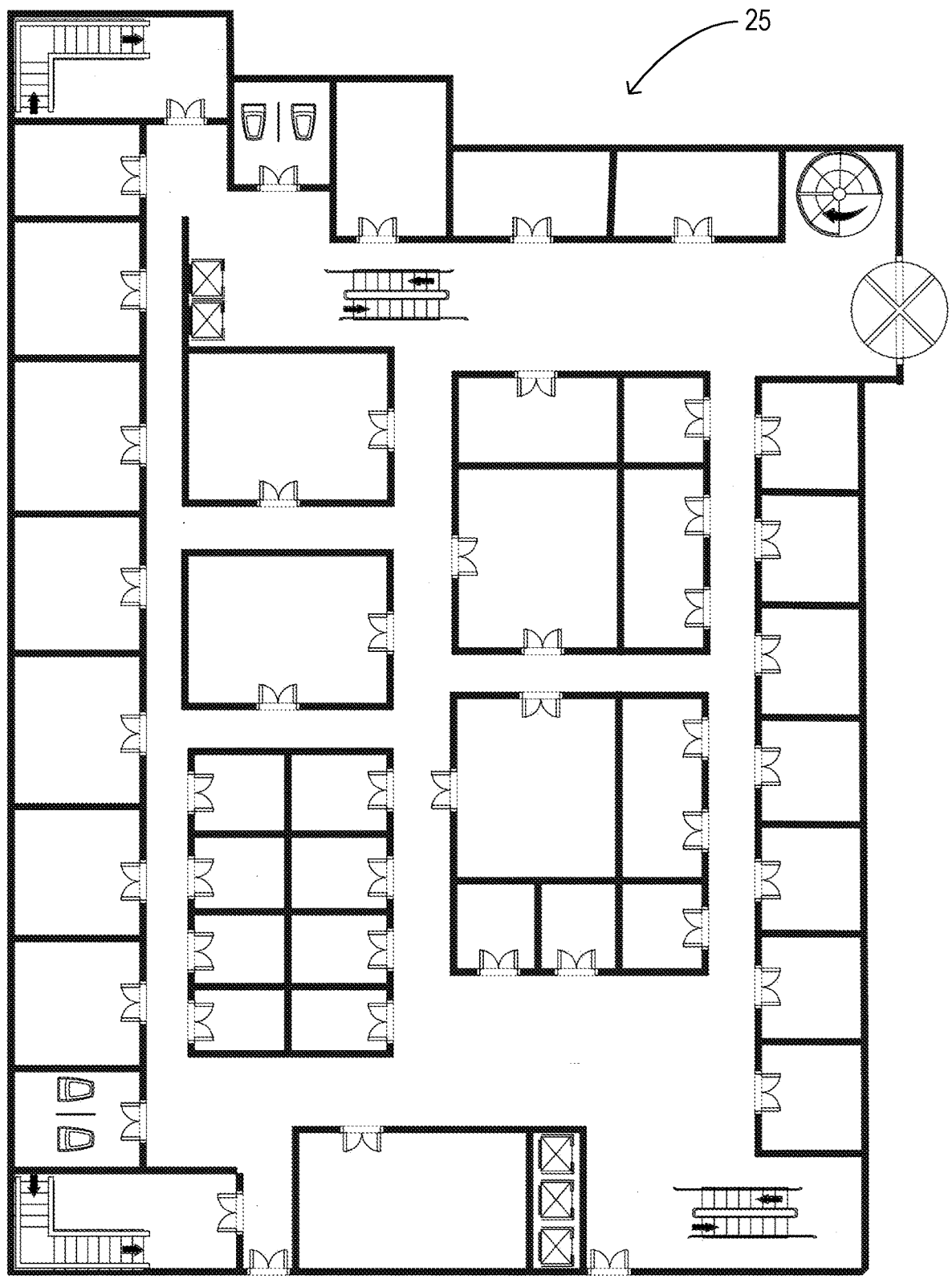
FIG. 5 is a floor plan used for automating design and layout for a beacon system.

In a preferred embodiment, two types of input are utilized by IBeaconMap including 1) the floor plan itself and 2) a set of architectural features that the algorithm should attempt to recognize in the image. A typical floor plan to be used is a drawing to scale to show an indoor space's details (such as rooms and stairs) from a top view. The image can be in various file formats (e.g., PDF, JPEG, BMP, and .DXF). A typical floorplan may show interior walls and hallways, restrooms, windows and doors, interior features such as fireplaces, saunas and whirlpools, rest areas, service counters and many other PoIs within buildings. It may also show an indoor space's orientation and to what scale the floor plan is drawn. FIG. 5 shows an example of a scaled floor plan image 25. Based on a scale factor, it is possible to extract distances between any two PoIs from the floor plan image by factoring in image resolution and the number of pixels that separate them. Image 25 is a binary image with an image background (e.g., white pixels) and an image foreground (e.g., black pixels). More generally, the foreground includes the lines and symbols of the floor plan drawing.

Figure 10:
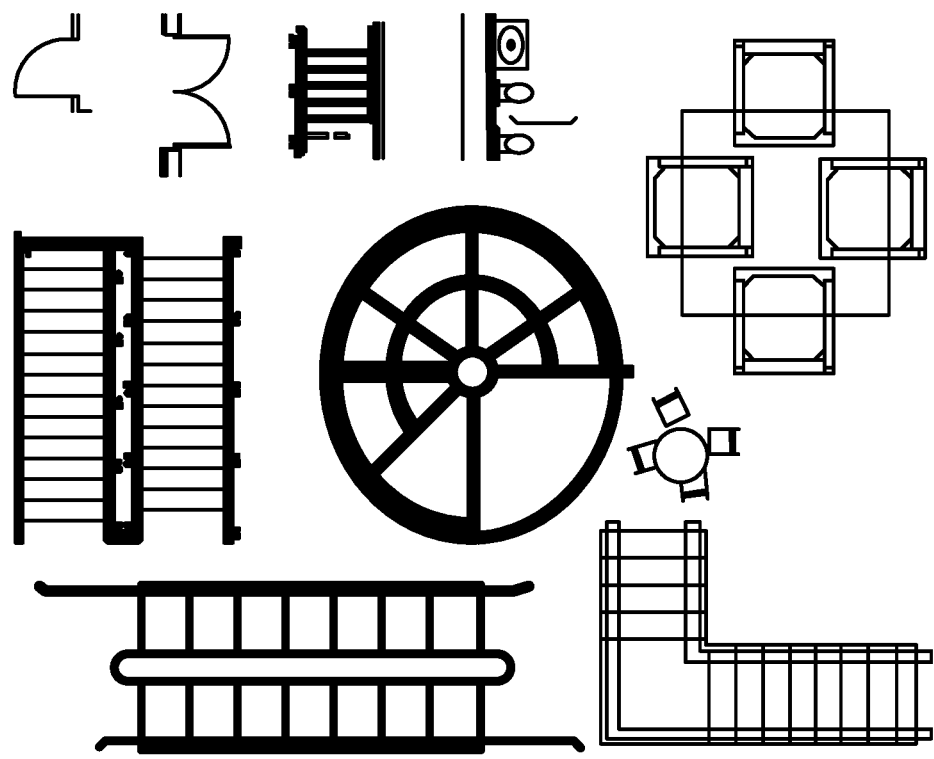
FIG. 10 shows a collection of floor plan building blocks that may be used for determining an indoor path and for determining points of interest.

Building blocks (such as shown in FIG. 10) are features of a building shown by specific symbols which correspond to important drawing elements which identify possible destinations or waypoints for subsequent indoor wayfinding. These symbols are usually common between various architecture drawings and, therefore, a database of building blocks can be constructed and harnessed by an application trying to locate them on a floorplan. Building blocks can be categorized into various groups which can be prioritized based on the application needs. For example, those building blocks which are used to represent features related to indoor walking paths can be in the first group and summoned first. To be computationally efficient (reducing processing time), building blocks to check for on a floor plan can be selected based on the type of space under consideration. For example, a pool or sauna is not expected to be seen in a research building, but doors, stairs, elevators, and other building blocks would be expected.

Based on the floor plan image, the set of building blocks, the scale factor, and the map orientation, the disclosure seeks to produce a connectivity graph with distance-based weights and compass orientation of each edge (i.e., walking path). A preferred embodiment proceeds in four phases. In phase 1, the indoor path within the space is identified and removed for further analysis. In phase 2, all building blocks (i.e., navigational PoIs) within the remaining floor plan image are identified. In phase 3, a skeleton of the indoor path is generated with adjoining building blocks mapped onto it. Finally, in phase 4 a connectivity graph is created through a traversal of the skeleton. An overall algorithm for performing IBeaconMap is summarized as follows:

| Step | Task |
|---|---|
| 1 | $R_i$ = regionprops (FloorPlan, "Area") {Using 'Area' as a property to label the actual number of connected pixels in each region of the floor plan and save them in an array} |
| 2 | $R_{indoorpath}$ = Max($R_i$) {Choose the region with maximum area} |
| 3 | $Flr_f$ = detectfeatures(FloorPlan) {Return an array with various features of the input floor plan} |
| 4 | $(x, y)_j$ = classifyfeatures($Flr_f$, option) {classify features using specified technique as option (1: FDM, 2: FDM + SML, 3: FD + SML) in floor plan as building blocks of interest and return pixel indices} |
| 5 | $(x; y)_{indoorpath}$ = sel($(x, y)_j$; $R_{indoorpath}$) {Select matched building blocks which are in the indoor path} |
| 6 | skel = bwmorph($R_{indoorpath}$, 'skel') {Morphological operation using 'skel' as a property to remove pixels from the boundaries of the indoor path without breaking it apart} |
| 7 | $(x, y)$skeleton = Map($(x, y)_{indoorpath}$, skel) {Map $(x, y)_{indoorpath}$ on the indoor path skeleton} |
| 8 | Path = BFS($(x, y)_{skeleton}$) {Determine connectivity information (distance in pixels, orientation) between every two adjacent nodes on the skeleton using a breadth first traversal, storing a string of orientation directions from each path} |
| 9 | Use image scale factor and resolution to find physical distances from any two building blocks to use as weights of the connectivity graph |

Phase 1

The goal of phase 1 (steps 1-2) is to extract the indoor path and adjoining PoIs from the floor plan. The walking path connects all the building blocks (doors, stairs etc.) to each other, so finding it first makes it easier to find PoIs. Furthermore, having the indoor path helps find the shortest path from any office or point of interest to any other. Walking paths are found by identifying the largest contiguous block of pixels within the indoor space as represented by the background pixels in image 25. This contiguous block of background pixels has to be the walking path with all other areas within the floor plan having disconnections due to doors, walls, stairs, etc. The largest contiguous area is then labeled so that it can be marked off as the walking path.

Figure 6:
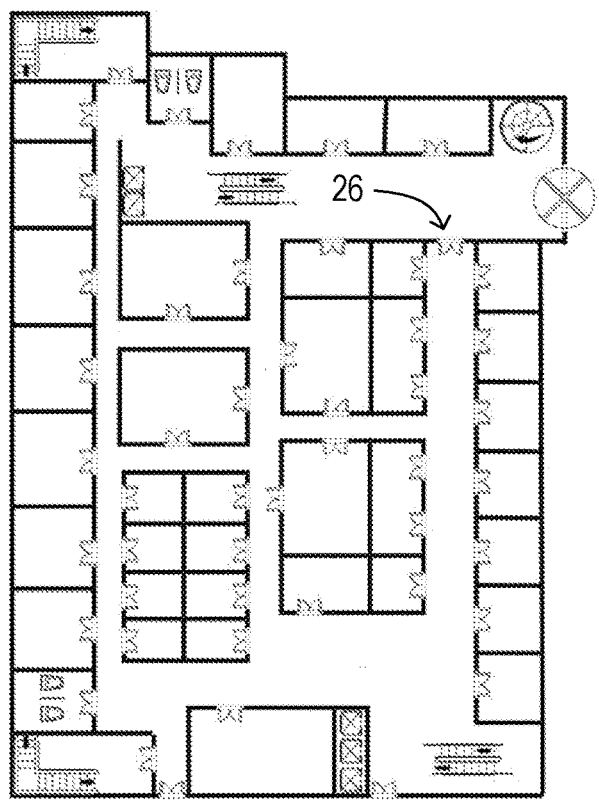
FIGS. 6 and 7 are an initial floor plan and a cropped floor plan according to one embodiment.
Figure 7:
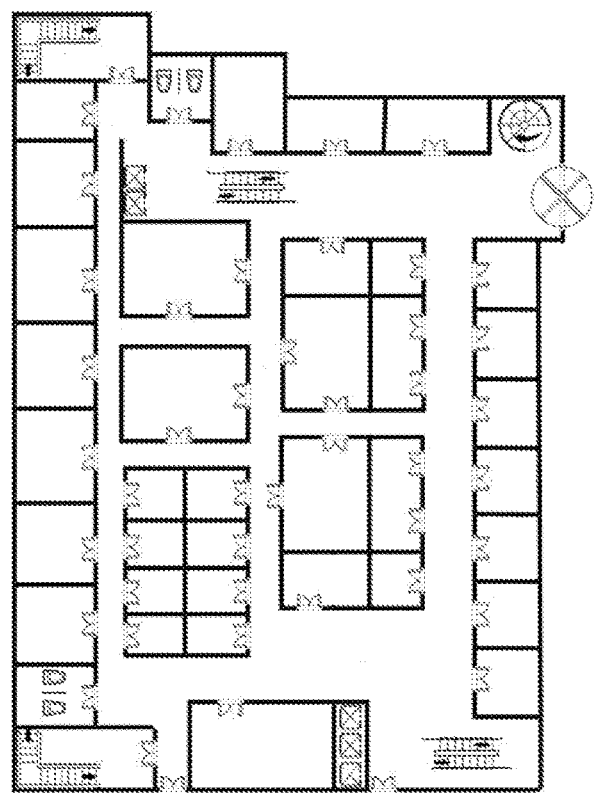

In some scenarios, a door or any other connected building block in the foreground can be inside the area of the indoor path. As these building blocks are known by architects, the same method that is used to detect doors and stairs can be used. Thus, it is desirable to find building blocks which can be seen in indoor paths and then by removing those building blocks (e.g., ignoring or cropping the building block which would otherwise mask a passable area) the indoor path can be detected. For example, a floor plan shown in FIG. 6 includes a doorway 26 which corresponds to a passable area within an indoor walking path but which would appear to be unpassable since it creates a division between open pixel regions. By removing the doorway building block as shown in FIG. 7, the area can be detected as passable. The removal of doorway 26 can be performed manually while preparing the floorplan image, for example.

Figure 8:
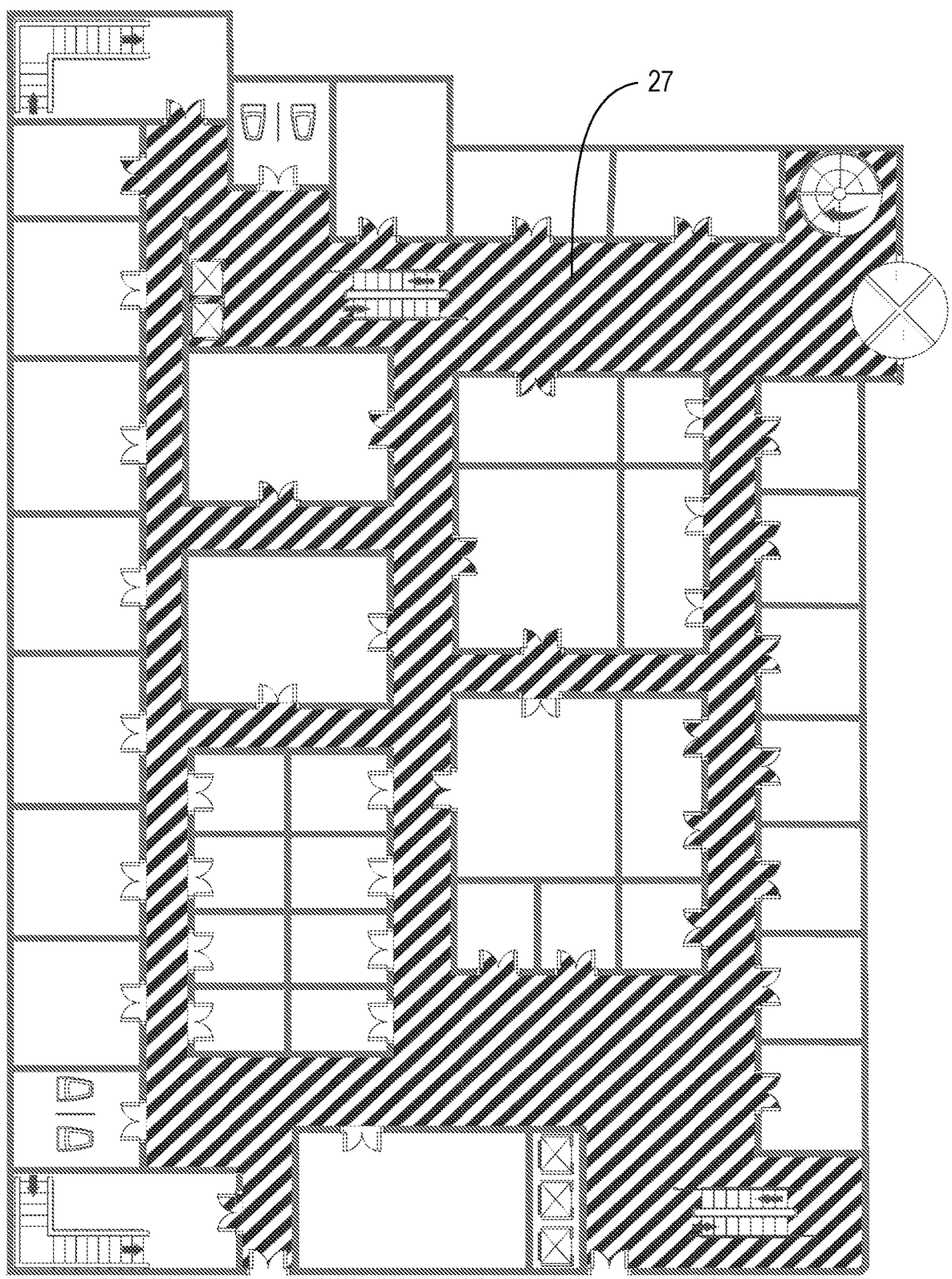
FIG. 8 is the floor plan of FIG. 5 with a largest region of continuous pixels identified.
Figure 9:
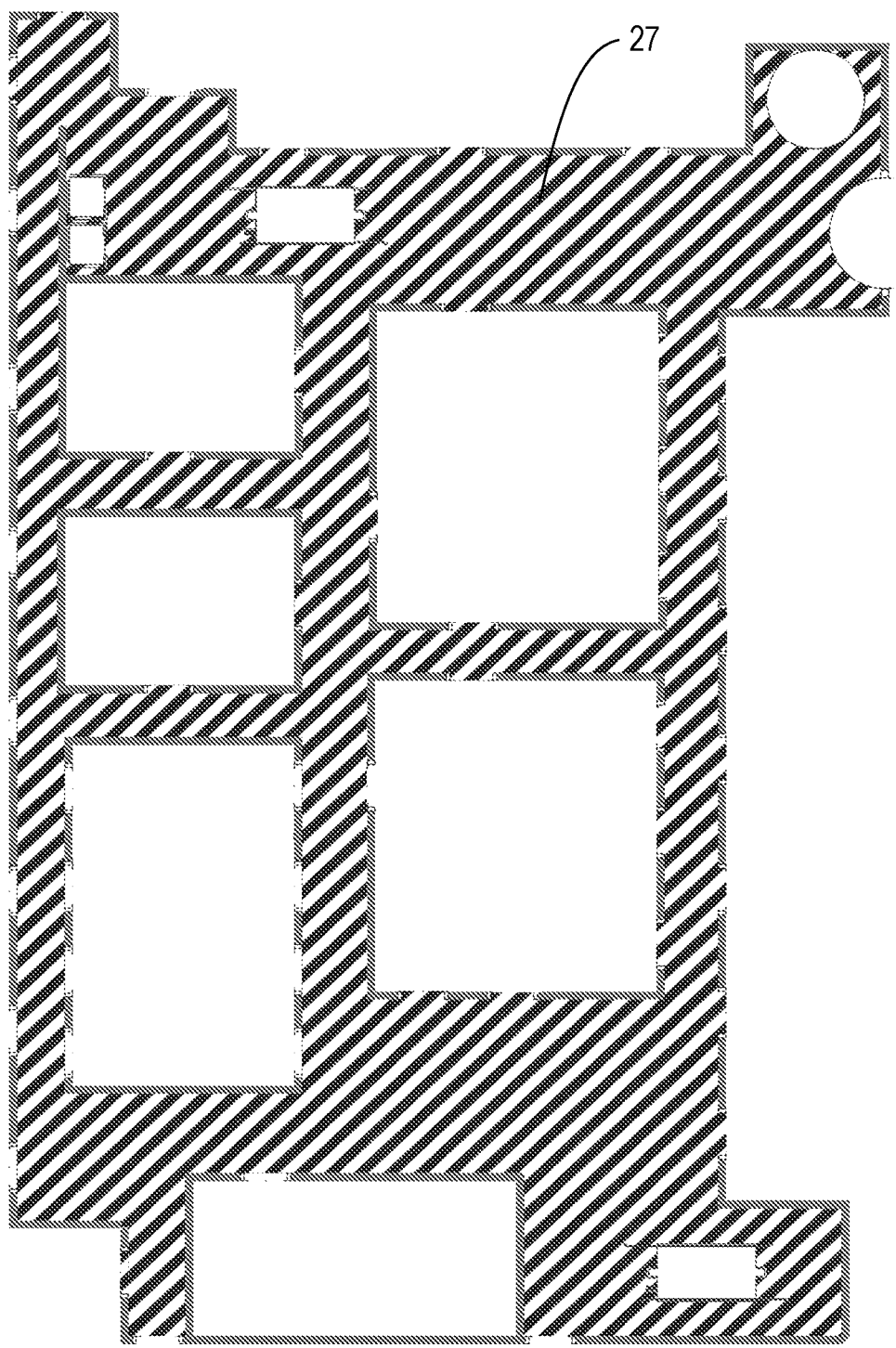
FIG. 9 depicts a main indoor path region derived from the region of FIG. 8.

After removing the connected building block, the indoor path would have the highest number of pixels making it easy to locate it (e.g., region 27 in FIG. 8 is selected as the main indoor path shown in FIG. 9). Floor plans that might have big areas outside the margins of the floor plan can make it a challenge for the labeling method to work as expected. This can be solved by simply cropping the regions outside of the floor plan from the image. Once the indoor path is found, all the other building blocks within enclosed areas which are only accessible by authorized users such as rooms inside an office can also be ignored.

Phase 2

After having obtained the indoor path, the next step is to find all the required building blocks in a floor plan and get the specific coordinates of their locations on the floorplan (steps 3-6). To achieve this goal, the disclosure provides three alternative approaches (e.g., which may be selected by the user according to the circumstances). The three approaches may include i) feature detection and matching (FDM), ii) feature detection, matching, and supervised machine learning (FDM+SML), and iii) feature detection and supervised machine learning (FD+SML). The reason to select between three different techniques is to provide options to users when faced with varying quality and complexities of floor plans supplied as input. The FDM approach is the fastest of the three, and is very accurate if the provided floor plans are of high resolution and without a high density of features. If the provided floor plan does not meet this criteria (as is possible when using scanned images of floor plan drawings made many decades ago), the accuracy can suffer. Having the other two approaches besides FDM provides more opportunities to arrive at an acceptably accurate result within an acceptable time. The addition of SML to FDM allows removing some false positives from the FDM approach output, helping improve accuracy. For cases where FDM is expected to have very high inaccuracies, it can be skipped altogether. Instead, a preprocessing step of FD can be executed to first collect all possible features in the floor plan (a computationally intensive step) followed by SML to classify building blocks with reasonable accuracy.

Feature Detection and Matching Approach

Using object recognition and matching, which are common image processing techniques to detect features of an image, building blocks in the floor plan are found. This process resembles image registration procedures which overlay two images from the same scene but from different angle or different sensors over each other (two steps that are common are Image Feature Detection and Feature Matching). Feature detection is an image processing technique that has widely been used in the computer vision community. Image classification and retrieval, object recognition and matching, and texture classification are additional areas that typically use feature detection. In this step, salient and distinctive components of an object or an image such as corners, curves, and edges are detected. Feature matching is a process of matching detected features exhibiting a similar appearance (i.e., a predetermined level of congruence) between two images. It is part of many computer vision applications such as image registration and object recognition. Two potential approaches to detect target features in an image include area-based methods and feature-based methods. In the case of indoor buildings there are enough distinctive and detectable objects to be able to use a feature-based method of the type disclosed in Shi et al., *Good Features To Track*, IEEE Conference on Computer Vision and Pattern Recognition (CVPR94), Seattle, June 1994, which is incorporated herein by reference. The disclosed method provides relatively good accuracy and low processing time. After detecting and extracting features, matching is performed next. By using an exhaustive method of determining the pairwise distance between features found from the floor plan, they can be matched over each other. The sum of squared difference (SSD) is used to measure the distance between features to perform this matching. By adapting this method to compare features in the foreground image with predetermined target features (e.g., a symbol library of the type shown in FIG. 10), the desired building blocks which are coincident with the main path are classified/identified.

Supervised Machine Learning after Feature Detection and Matching

For cases where image resolution is not high enough, FDM may inaccurately classify certain features (e.g., a false detection of a door). In such cases, an addition of supervised machine learning techniques can help eliminate such false positives. In a hybrid approach, after finding building blocks using FDM the locations containing detected building blocks are cropped from the floor plan image. These cropped images of the floor plan together with the image coordinates of their centers are passed to a Supervised Machine Learning (SML) module for classification, such as a Support Vector Machine (SVM). As an efficient classifier, SVM uses given labeled training data to define an optimal hyperplane for classification purposes. This estimated hyperplane is used to classify the cropped images to one building block (doors in this case), so as to eliminate many false positives. An SVM module can utilize available software tools such as LIBSVM available from National Taiwan University and the Spider object library for use in Matlab.

Supervised Machine Learning after Feature Detection

In cases where the matching process in FDM struggles badly to detect locations containing pre-designated building blocks, the upfront matching of predetermined symbols can be skipped. In this embodiment, feature detection (FD) is used as the only pre-processing step to collect all potential features from the supplied floor plan. Executing SML mechanisms on this set of collected features improves accuracy of classification. One consequence of this approach is that the number of detected features on some floor plans can be very large (hundreds of thousands), making it computationally intensive for running SML on the resulting data set. Thus, a K-Means clustering technique can be employed on the densely populated features in a floor plan to reduce the candidate set of features to pass to the SML operations. K-Means clustering technique is an unsupervised learning algorithm to find groups of unlabeled data. Since the exact number of clusters (PoIs) cannot be foreseen, the algorithm starts with a default number of clusters in a segment (half of detected features) which is then revised based on relative separation between clusters. Eventually, using SML, building blocks can then be sifted out from those symbols that are not building blocks. The three-step FD+SML approach takes more processing time than the other schemes, but can be more accurate than the others, especially with low resolution images and high feature density floor plans.

Phase 3

After obtaining the building blocks' locations in terms of (x,y) pixels using one of the above techniques, the next phase may begin by separating and extracting smaller areas from the floor plan (Image Segmentation). A preferred embodiment first uses a technique called image dilation where all the lines (walls, doors, etc.) are made thicker so that any small disconnections on a line are filled. Using a labeling method, areas can be removed which are smaller than a threshold. By removing the already located indoor path and a margin area around the floorplan, all or most of the rooms can be identified. Then in step 6, a skeleton path is generated as shown in FIG. 11.

To connect a walking path for navigating from any point of interest to another, a path segment is needed that does not pass through a wall, stair, or any point having a color other than white (i.e., the pixel value indicating the image background after the floor plan is converted to a binary image). Since the locations of the detected building blocks can be on the black (foreground) line or be blocked in some ways, it is desired to map them onto specific pixels of the indoor path that was already determined. To achieve this efficiently, a skeleton is generated wherein the boundary pixels of the indoor path are removed without letting the indoor path break apart. For example, in a Matlab representation of the indoor path, the morphological operation bwmorph is applied with the "skel" function to iteratively thin the region (step 6). Then, by using Euclidean distance in step 7, the closest points on the resulting indoor path skeleton to the building blocks are located and joined with the skeleton representation as shown in FIG. 11.

Figure 11:
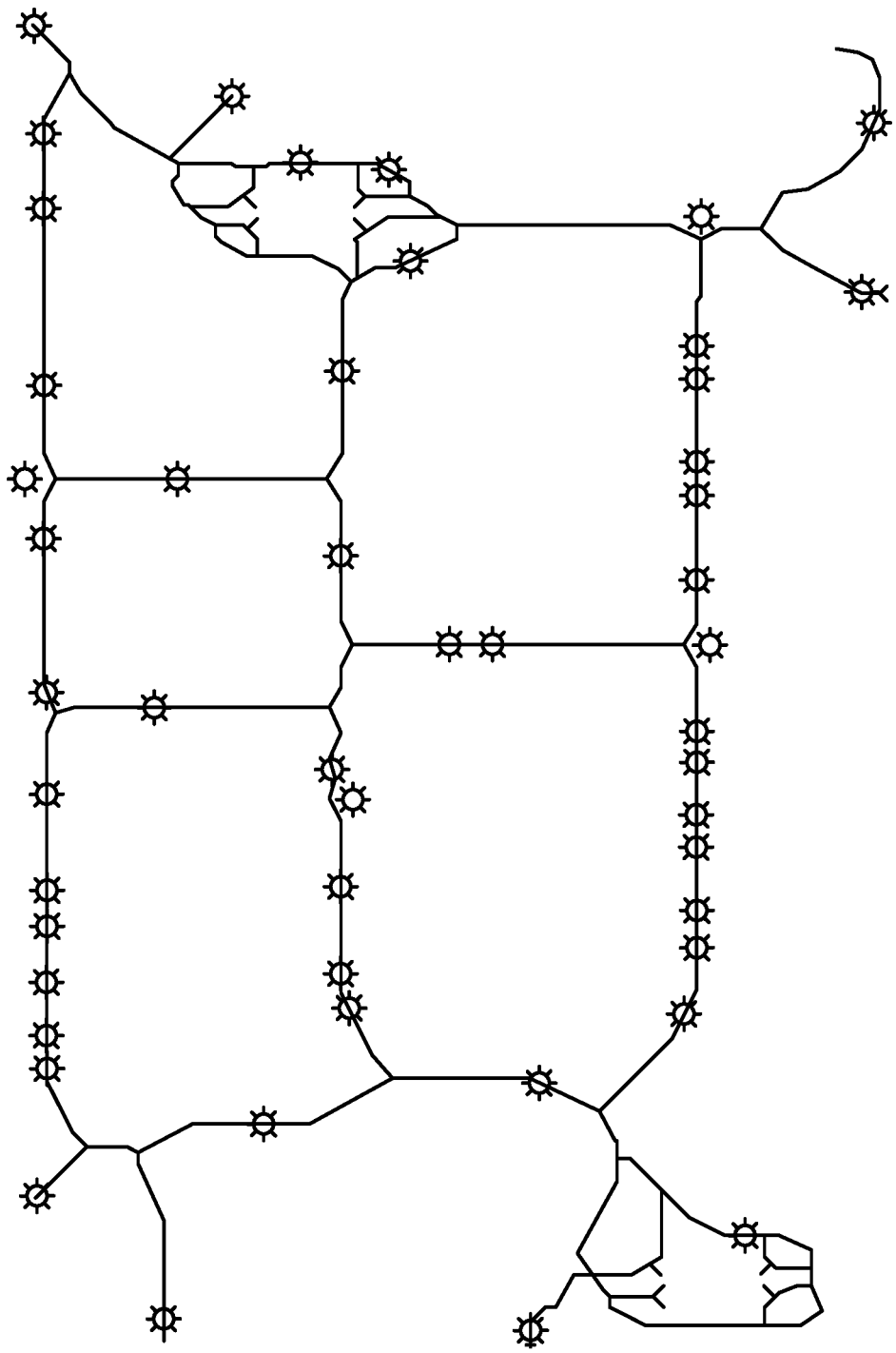
FIG. 11 is an indoor path skeleton derived from the indoor path region and having beacon locations added corresponding to path nodes and points of interest.
Figure 12:
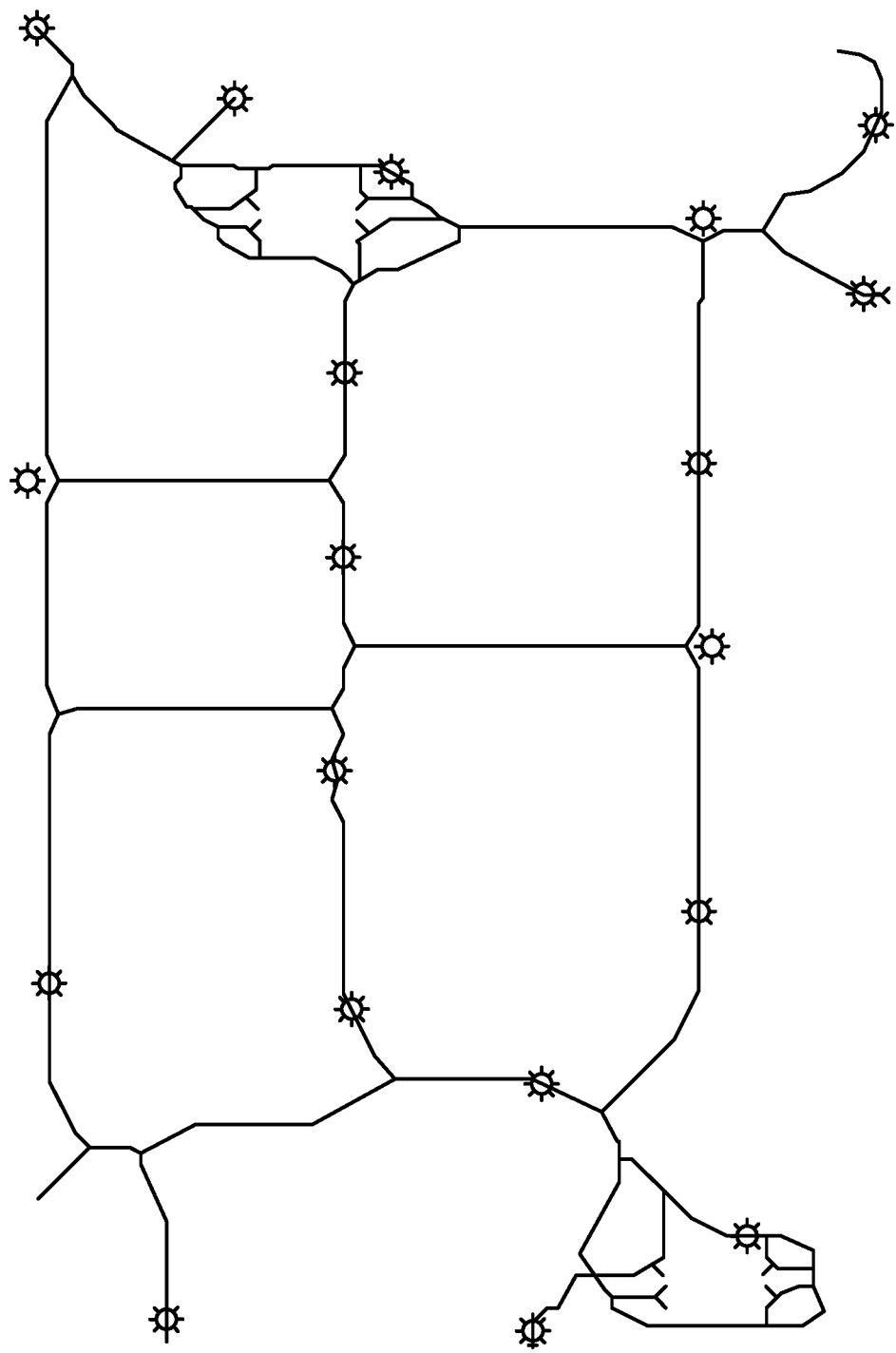
FIG. 12 shows a modified beacon placement with beacons removed to avoid overlapping beacons and with beacons added to ensure continuous coverage.

In FIG. 11, each PoI or node (i.e., whether a building block or an intersection in the skeletonized path) is preliminarily designated as a beacon location. Thus, each room, office door, stairway, elevator, and the like is tagged with a beacon. Since the normal operating range of the beacons may be greater than the distance between many preliminary beacon locations, an automated process can be conducted wherein extra beacon locations are subtracted. An optimal operating range of the beacons to be deployed is used to identify a predetermined target spacing between beacons. Working along segments of the main path, selected preliminary beacon locations are eliminated which are not necessary to maintain the predetermined target spacing. As explained in greater detail below, any PoIs that may have been missed in the automated beacon placement can be manually added as beacon locations by the user.

Phase 4

After mapping building blocks on the indoor path skeleton and identifying the optimal locations for beacon placement, additional processing can be performed in connection with compilation of the navigation database to be used in generating routes and instructions for users once the wayfinding system is installed. This involves finding the paths connecting any PoIs to create a connectivity graph on which path computations for navigation can be performed (as shown in steps 8 and 9). For each path, the direction to take to move along the paths (or orientation) is extracted and stored. Conversion from the pixels on the floor plan to actual distances is performed using scaling according to the scale factor of the specific floor plan under consideration. During initial input of a floor plan, a reference compass direction and the scale factor are also provided as input. For example, a typical scale factor may be 1/16 inch=1 foot. It is required that the image dimensions (width and height) and both the horizontal and vertical resolution (e.g., 2200×3400 image dimensions, 200 dpi horizontal resolution, and 200 dpi vertical resolution) are also provided as input.

Figure 13:
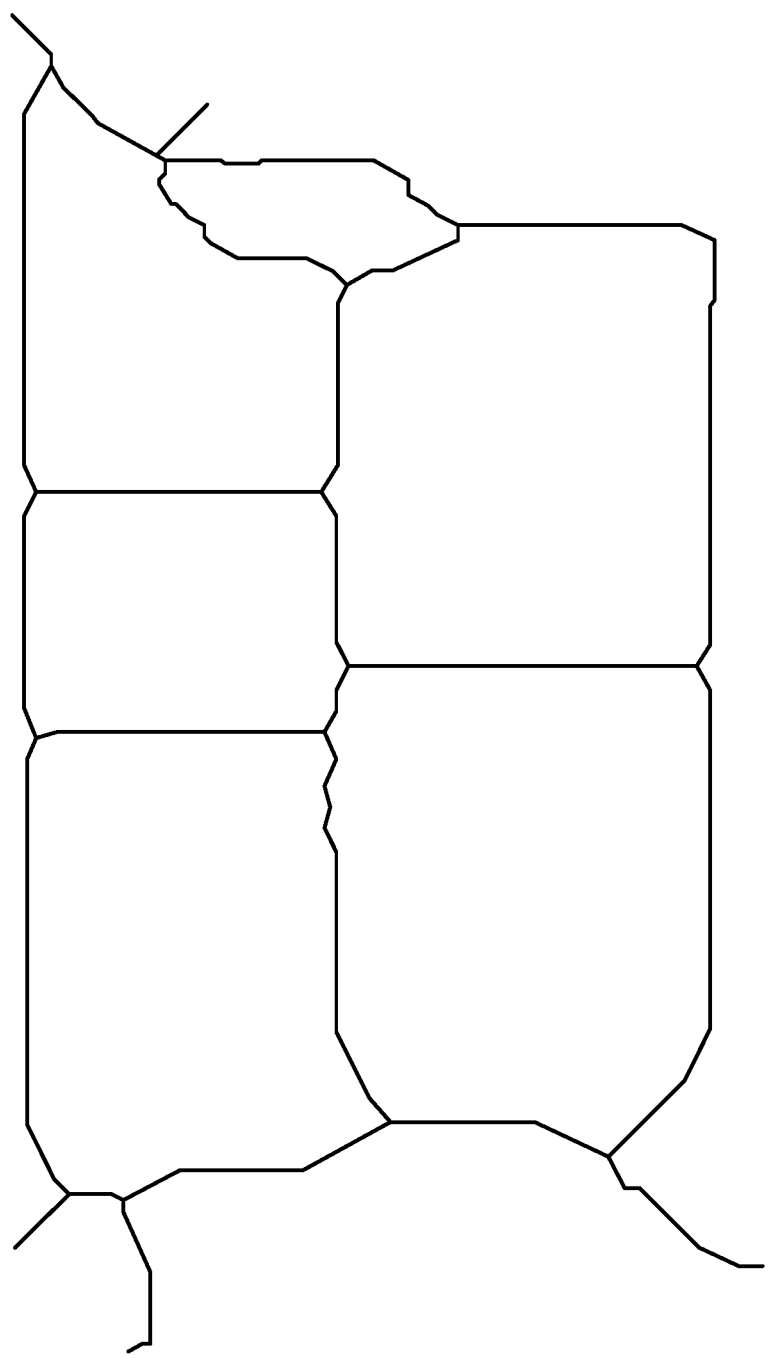
FIGS. 13 and 14 show the skeleton path and the original floor plan overlaid with the skeleton path, respectively.
Figure 14:
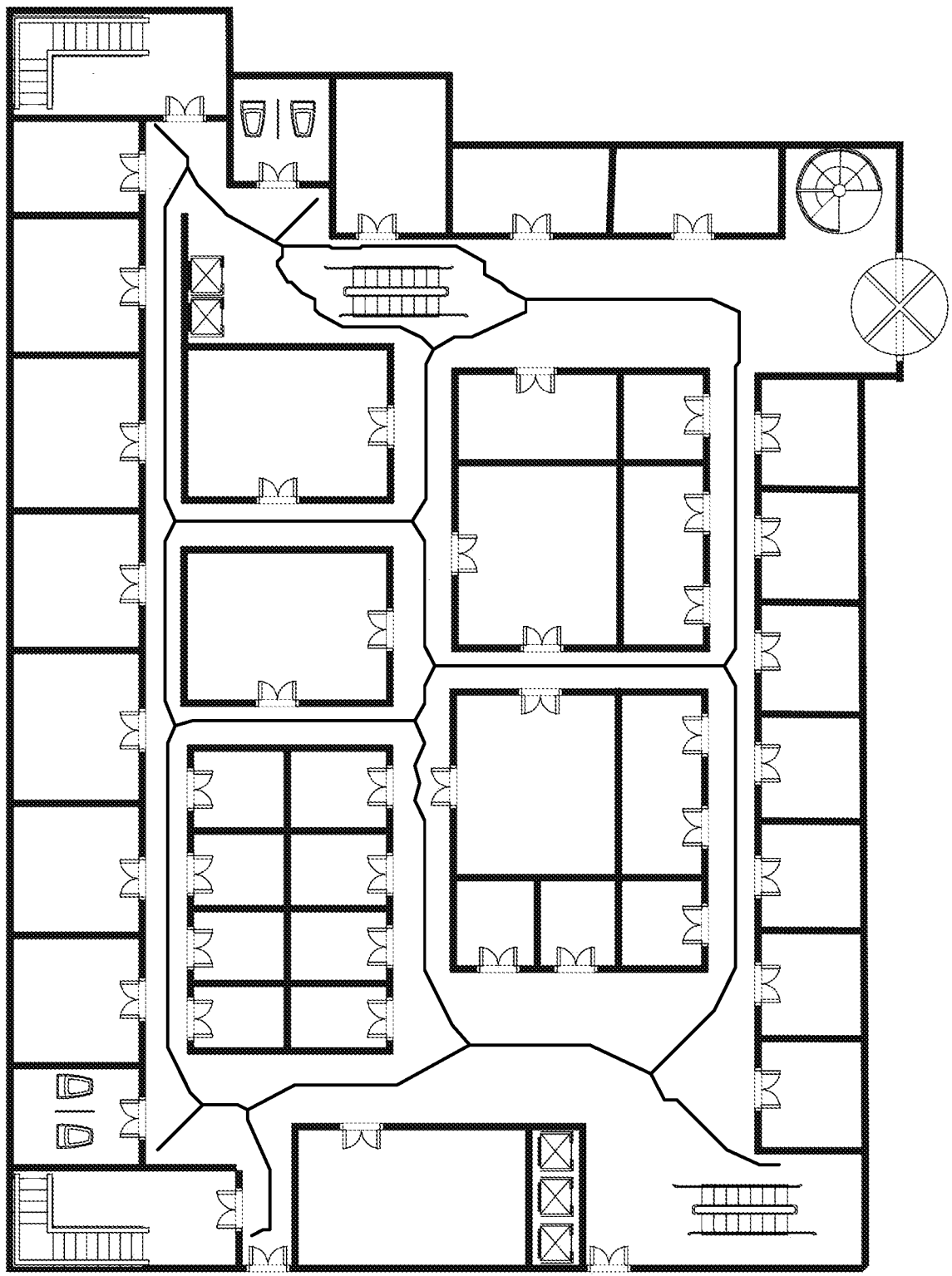

To determine one-hop path distances between PoI's, the disclosure considers the indoor path skeleton to be the only non-zero pixels in the floor plan image. This by itself does not provide the one-hop paths between PoIs, but the skeleton can be traversed in a breadth-first fashion beginning from a PoI pixel by pixel to find various features. Any saved connectivity information includes the starting location, the path and the destination and the coded number for each of the characters involved ('E', 'W', 'N', 'S', 'NW', 'NE', 'SW', 'SE') to arrive at orientation information for the path. The connectivity graph (FIG. 13) arrived at for the example floor plan overlaid on the floor plan is shown in FIG. 14.

Figure 15:
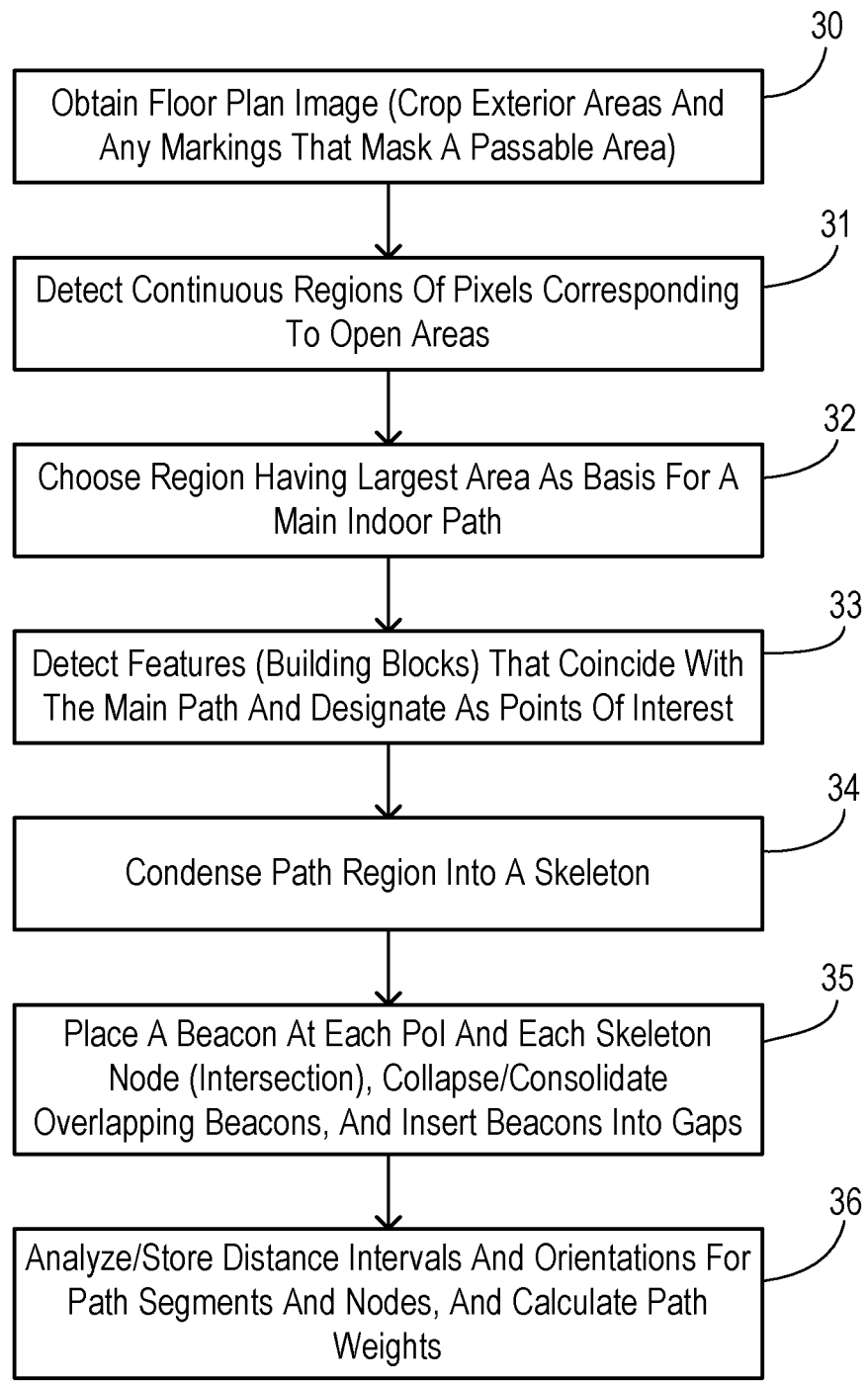
FIG. 15 is a flowchart showing one preferred embodiment of the disclosure.

FIG. 15 summarizes a preferred method of the disclosure. In step 30, a floor plan image is obtained as a binary image with a foreground and a background (e.g., a black and white image file). Irrelevant areas exterior to the intended navigating space may preferably be cropped. In the event that there are any markings or symbols present in the image that appear to block a passable area, they can also be cropped (i.e., erased) from the image foreground. The image scale, image dimensions, image resolutions, and reference compass directions are also identified.

In step 31, the image is scanned to detect each continuous pixel region in the image background (i.e., open areas of the floor plan). The largest such region (e.g., the region containing the most total number of pixels) is selected as the main indoor path.

In step 33, image features within the foreground are classified by comparison with predetermined target features. This detects the building blocks in the foreground which are coincident with the main path. The coincident building blocks and nodes (e.g., intersections) within the main path are designated as navigational points of interest. In one embodiment (the FDM embodiment), step 33 is comprised of 1) identifying a plurality of building block symbols used in the floor plan image, 2) iteratively overlaying the plurality of symbols at pluralities of locations on the floor plan image, and 3) detecting occurrence of a corresponding building block when an overlaid symbol has a predetermined congruence with the floor plan image. In addition, step 33 can further include 4) scanning the foreground for blocks of pixels potentially representing an image feature (i.e., without direct comparisons based on just the predetermined building block symbols, wherein the pluralities of locations for iteratively overlaying the symbols consist of the blocks of pixels potentially representing an image feature.

In another embodiment (the FDM+SML embodiment), step 33 is comprised of 1) identifying a plurality of building block symbols used in the floor plan image, 2) iteratively overlaying the plurality of symbols at pluralities of locations on the floor plan image, 3) detecting occurrence of a potential building block when an overlaid symbol has a predetermined congruence with the floor plan image, 4) cropping a corresponding portion of the floor plan image for each potential building block, and 5) verifying the potential building blocks by classifying each cropped portion using a trained database via supervised machine learning. The trained database represents a plurality of building block symbols, and the step of designating the coincident building blocks considers only the potential building blocks that are verified.

In yet another embodiment (the FD+SML embodiment, step 33 is comprised of 1) scanning the foreground for blocks of pixels potentially representing an image feature, and 2) classifying each block of pixels that potentially represents an image feature using a trained database via supervised machine learning, wherein the trained database represents a plurality of building block symbols.

In step 34, the continuous pixel region of the main path is condensed into a skeleton representation. A preliminary beacon location is designated in step 35 at each point of interest and at each node of the skeleton representation. Based on a target spacing of beacons in accordance with the optimum reception range for the beacons, the preliminary beacon locations are collapsed/consolidated to minimize overlapping of the BLE transmission zones of the beacons. If any PoIs were missed during the automated processes, then additional beacon locations can be inserted at those PoIs and any intervening gaps as necessary.

To facilitate the generation of a navigation database for the navigation space, a connectivity graph can be generated and stored in step 36. For example, distance intervals and directional orientations for path segments between adjacent nodes and PoIs are determined based on the image scale and resolution. Then relative path weights are calculated for the path segments to support route calculations via a navigation map compiled for the wayfinding system. The weights can be proportional to the length of a path segment, for example.

An IBeaconMap tool can be embodied as a software application to assist in configuring a wayfinding system by identifying beacon placement locations within a navigating space. The tool can be adapted to provide various options for a user to pre-process floor plans that are being input. Common pre-processing tasks could include: (i) cropping the image to remove annotations and other symbols outside the floor plan boundaries, (2) marking certain areas to be protected and outside the bounds of navigation, and (3) marking off areas that should not be considered as part of the walking paths due to furniture or other objects. Levels of restricted areas can be defined such that there are authorizations between full public access and no public access. For example, within an airport, the secure zones have restrictions for entry from many doors, but do allow walking once entered through an identified entryway.

Once a floor plan image is uploaded, the user is provided three options for building block detection. The FDM method is recommended for cases where the image resolution is sufficiently high and the floor plan is of a simple and small space. If these criteria are not met, then FD+SML method is recommended, though it can take extra time for processing. The FDM+SML option is also presented as an alternative to FDM, although it takes a bit more time to process. A user can run all three options and compare results if they choose to do so. In addition, the user is asked if they want just indoor walking path detection or a full floor plan detection of PoIs. If there are secure/restricted areas to be marked, that is done first before proceeding with the indoor path or full floor plan detection.

As post-processing steps, the IBeaconMap tool preferably allows "scrubbing off" any redundant locations that should not be beacon locations, while allowing adding of new locations which were possibly missed during processing, just by clicking with a mouse pointer. The post-processing can also include labeling beacon locations with descriptive detail and context required for navigating, which is then automatically incorporated into a navigation database.

The foregoing disclosure provides an automated technique called IBeaconMap to prepare an indoor space for beacon-based wayfinding for the BVI and other sighted users. Such a technique solves the current challenge of creating indoor space representations in a time and labor-efficient manner. IBeaconMap simply takes a floor plan of the indoor space under consideration and employs a combination of image processing and computational geometrical techniques to arrive at locations where beacons can be deployed and builds a weighted connectivity graph among these locations that can be subsequently used for navigation. Evaluations show IBeaconMap to provide fast and accurate results, thus presenting itself as a scalable tool in preparing all indoor spaces for beacon-based wayfinding.

What is claimed is:

1. A method of configuring a wayfinding system including identifying beacon locations within a navigating space, comprising the steps of:

preparing a scaled floor plan image representing the navigating space as a binary image with a foreground and a background;

detecting continuous regions of pixels in the background;

selecting a continuous region in the background having a largest pixel area as a main indoor path;

classifying image features within the foreground by comparison with predetermined target features to identify building blocks in the foreground which are coincident with the main path;

designating the coincident building blocks and nodes within the main path as navigational points of interest, wherein the nodes include intersections in the main path;

condensing the continuous pixel region of the main path into a skeleton representation; and designating a preliminary beacon location at each point of interest and at each node of the skeleton representation.

2. The method of claim 1 further comprising the step of:
adding or subtracting beacon locations according to a predetermined target spacing between adjacent final beacon locations.

3. The method of claim 1 further comprising the steps of:
storing a connectivity graph including distance intervals and directional orientations for path segments between adjacent nodes and points of interest; and
calculating relative path weights for the path segments to support route calculations via a navigation map compiled for the wayfinding system.

4. The method of claim 1 wherein the step of classifying image features is comprised of:
identifying a plurality of building block symbols used in the floor plan image;
iteratively overlaying the plurality of symbols at pluralities of locations on the floor plan image; and
detecting occurrence of a corresponding building block when an overlaid symbol has a predetermined congruence with the floor plan image.

5. The method of claim 4 further comprising the step of:
scanning the foreground for blocks of pixels potentially representing an image feature;
wherein the pluralities of locations for iteratively overlaying the symbols consist of the blocks of pixels potentially representing the image feature.

6. The method of claim 1 wherein the step of classifying image features is comprised of:
identifying a plurality of building block symbols used in the floor plan image;
iteratively overlaying the plurality of symbols at pluralities of locations on the floor plan image;
detecting occurrence of a potential building block when an overlaid symbol has a predetermined congruence with the floor plan image;
cropping a corresponding portion of the floor plan image for each potential building block;
verifying the potential building blocks by classifying each cropped portion using a trained database via supervised machine learning, wherein the trained database represents a plurality of building block symbols;
wherein the step of designating the coincident building blocks considers only the potential building blocks that are verified.

7. The method of claim 6 further comprising the step of:
scanning the foreground for blocks of pixels potentially representing an image feature;
wherein the pluralities of locations for iteratively overlaying the symbols consist of the blocks of pixels potentially representing the image feature.

8. The method of claim 1 wherein the step of classifying image features is comprised of:
scanning the foreground for blocks of pixels potentially representing an image feature; and
classifying each block of pixels that potentially represents the image feature using a trained database via supervised machine learning, wherein the trained database represents a plurality of building block symbols.

9. The method of claim 1 further detecting enclosed rooms in the floor plan image comprising the steps of:
dilating pixel regions corresponding to the main path and the coincident building blocks; and
labeling continuous regions within the background not including the dilated pixel regions and having a corresponding area within a predetermined range of area as a respective room.

10. A system for configuring a wayfinding system including identifying beacon locations within a navigating space, comprising:
a module for storing a scaled floor plan image representing the navigating space as a binary image with a foreground and a background;
a module for detecting continuous regions of pixels in the background and selecting a continuous region in the background having a largest pixel area as a main indoor path;
a module for classifying image features within the foreground by comparison with predetermined target features to identify building blocks in the foreground which are coincident with the main path;
a module for designating the coincident building blocks and nodes within the main path as navigational points of interest, wherein the nodes include intersections in the main path;
a module for condensing the continuous pixel region of the main path into a skeleton representation; and
a module for designating a preliminary beacon location at each point of interest and at each node of the skeleton representation.

11. The system of claim 10 further comprising:
a module for adding or subtracting beacon locations according to a predetermined target spacing between adjacent final beacon locations.

12. The system of claim 10 further comprising:
a module storing a connectivity graph including distance intervals and directional orientations for path segments between adjacent nodes and points of interest; and
a module calculating relative path weights for the path segments to support route calculations via a navigation map compiled for the wayfinding system.

13. The system of claim 10 wherein the module for classifying image features is comprised of:
a module for identifying a plurality of building block symbols used in the floor plan image;
a module for iteratively overlaying the plurality of symbols at pluralities of locations on the floor plan image; and
a module for detecting occurrence of a corresponding building block when an overlaid symbol has a predetermined congruence with the floor plan image.

14. The system of claim 13 further comprising:
a module for scanning the foreground for blocks of pixels potentially representing an image feature, wherein the pluralities of locations for iteratively overlaying the symbols consist of the blocks of pixels potentially representing the image feature.

15. The system of claim 10 wherein the module for classifying image features is comprised of:
- a module for identifying a plurality of building block symbols used in the floor plan image;
- a module for iteratively overlaying the plurality of symbols at pluralities of locations on the floor plan image;
- a module for detecting occurrence of a potential building block when an overlaid symbol has a predetermined congruence with the floor plan image;
- a module for cropping a corresponding portion of the floor plan image for each potential building block; and
- a module for verifying the potential building blocks by classifying each cropped portion using a trained database via supervised machine learning, wherein the trained database represents a plurality of building block symbols, wherein designating the coincident building blocks considers only the potential building blocks that are verified.

16. The system of claim 15 further comprising:
- a module for scanning the foreground for blocks of pixels potentially representing an image feature, wherein the pluralities of locations for iteratively overlaying the symbols consist of the blocks of pixels potentially representing the image feature.

17. The system of claim 10 wherein the module for classifying image features is comprised of:
- a module for scanning the foreground for blocks of pixels potentially representing an image feature; and
- a module for classifying each block of pixels that potentially represents the image feature using a trained database via supervised machine learning, wherein the trained database represents a plurality of building block symbols.

18. The system of claim 10 further comprising:
- a module for dilating pixel regions corresponding to the main path and the coincident building blocks; and
- a module for labeling continuous regions within the background not including the dilated pixel regions and having a corresponding area within a predetermined range of area as a respective room.

* * * * *